United States Patent
Lee et al.

(10) Patent No.: US 6,821,842 B1
(45) Date of Patent: Nov. 23, 2004

(54) [DRAM STRUCTURE AND FABRICATING METHOD THEREOF]

(75) Inventors: Yueh-Chuan Lee, Nantou County (TW); Shih-Lung Chen, Taipei Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/708,227

(22) Filed: Feb. 18, 2004

(30) Foreign Application Priority Data

Sep. 19, 2003 (TW) .......................... 92125866 A (51) Int. Cl.⁷ .......................................... H01L 21/8242
(52) U.S. Cl. .................. 438/243; 438/246; 438/247; 438/248; 438/249; 438/289
(58) Field of Search .................. 438/243, 245–249, 438/289, 386, 388–392

(56) References Cited

U.S. PATENT DOCUMENTS

| | | | |
|---|---|---|---|
| 5,804,851 A | * 9/1998 | Noguchi et al. ............ 257/304 |
| 5,874,758 A | 2/1999 | DeBrosse ................... 257/305 |
| 5,994,198 A | * 11/1999 | Hsu et al. ................... 438/401 |
| 2002/0086481 A1 | * 7/2002 | Tsai et al. ................... 438/243 |
| 2003/0132438 A1 | * 7/2003 | Jang ............................. 257/68 |

* cited by examiner

Primary Examiner—Mary Wilczewski
Assistant Examiner—Toniae M. Thomas
(74) Attorney, Agent, or Firm—Jianq Chyun IP Office (57) ABSTRACT

A dynamic random access memory (DRAM) structure and a fabricating process thereof are provided. In the fabricating process, a channel region is formed with a doped region having identical conductivity as the substrate in a section adjacent to an isolation structure. The doped region is formed in a self-aligned process by conducting a tilt implantation implanting ions into the substrate through the upper portion of the capacitor trench adjacent to the channel region after forming the trench but before the definition of the active region.

18 Claims, 6 Drawing Sheets

[DRAM STRUCTURE AND FABRICATING METHOD THEREOF]

CROSS REFERENCE TO RELATED APPLICATIONS

This application claims the priority benefit of Taiwan application serial No. 92125866, filed on September 19, 2003.

BACKGROUND OF INVENTION

1. Field of the Invention

The present invention relates to a semiconductor fabrication process. More particularly, the present invention relates to a method of fabricating a dynamic random access memory (DRAM).

2. Description of the Related Art

Dynamic random access memory (DRAM) is a type of volatile and easy-to-access memory mostly for holding operating data in a computer. Typically, a DRAM consists of an array of cells each comprising a metal-oxide-semiconductor (MOS) transistor and a capacitor. The source/drain regions of the transistor are electrically connected to a capacitor and a bit line respectively. At present, DRAM capacitors are classified into stacked capacitor or trench capacitor. A stacked capacitor is formed over the transistor and a trench capacitor is formed below the transistor.

To lower the sub-threshold current of the transistor and increase data retention capacity of storage electrode in a trench type DRAM capacitor, dosage level of the threshold voltage adjustment implantation and/or pocket implantation is often increased. The pocket implantation is a process of forming a doped pocket region on one side of a bit line connected source/drain region. However, this process also intensifies the rise in electric field at the PN junction and hence increases the leakage current there.

SUMMARY OF INVENTION

Accordingly, at least one object of the present invention is to provide a dynamic random access memory (DRAM) fabrication process. In the process, a doped region having the same conductive type as a substrate is formed in a section of a channel close to an isolation region to reduce sub-threshold current.

To achieve these and other advantages and in accordance with the purpose of the invention, as embodied and broadly described herein, the invention provides a method of fabricating a dynamic random access memory (DRAM). First, trenches are formed in a substrate. A capacitor is formed inside each trench. Thereafter, active regions are defined over the substrate and then word lines are formed over the substrate. A pair of source/drain regions is formed in each active region and then bit lines are formed over the substrate. A first side of each active region has a first trench. The capacitor is coupled to the active region. Furthermore, a second side of each active region has a second trench. The word line passes through the active region and the second trench. The area in the active region covered by the word line serves as a channel region. In addition, the pair of source/drain regions in each active region is located on each side of a corresponding word line. The source/drain regions are electrically connected to a capacitor and a bit line respectively. One major aspect of this invention is the performance of a tilt ion implantation along the direction of the word line after forming the trenches but before defining the active regions. As a result, a doped region having the same conductive type as the substrate is formed on the edge of a region for forming the channel.

This invention also provides a dynamic random access memory (DRAM) structure fabricated using the aforementioned DRAM fabrication process. One major aspect of the DRAM structure is the presence of a doped region on a side edge of the channel region away from the source/drain region. The doped region has a conductive type identical to the substrate and a range limited to within the channel region.

In this invention, a word line passes over the trench adjacent to the second side edge of the active region. Furthermore, the doped region is formed on the side edge of the active region through a tilt ion implantation via the trench. Hence, the doped region is formed in a self-aligned manner in a section of the channel adjacent to an isolation region. Because the concentration of dopants in the doped region is higher, sub-threshold current in the channel region is suppressed. Furthermore, by increasing the depth of the doped region, punch-through leakage can be reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

In FIGS. 1, 2 and 7, the sub-diagrams with a label (C) are top views and the sub-diagrams with a label (A)/(B) are cross-sectional views along line A–A"/B–B" of the one labeled (C). In addition, FIGS. 7 and 8 are also diagrams for showing the DRAM structure according to one preferred embodiment of this invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1:
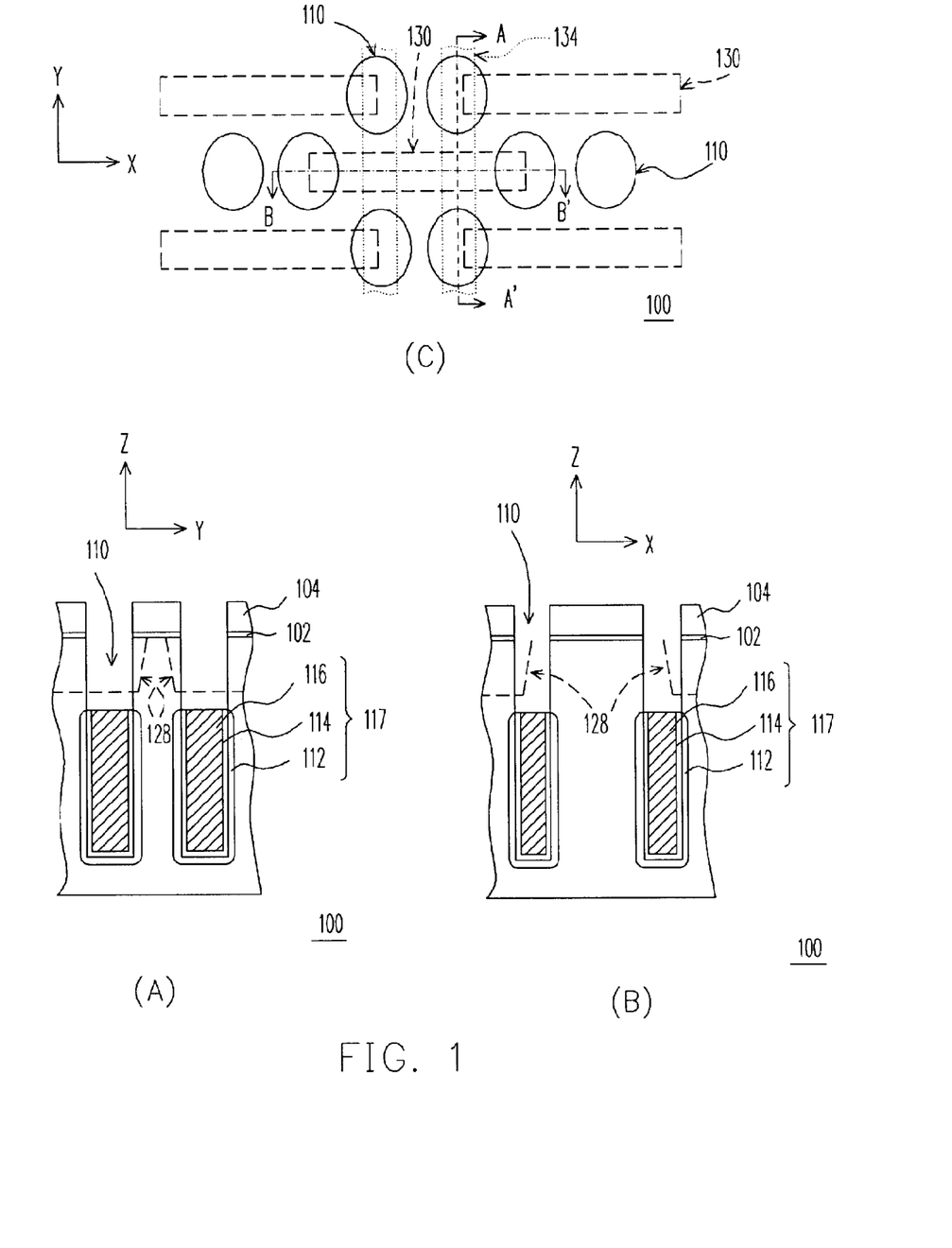
FIGS. 1 through 8 are diagrams showing the steps for producing a DRAM structure according to one preferred embodiment of this invention.
Figure 2:
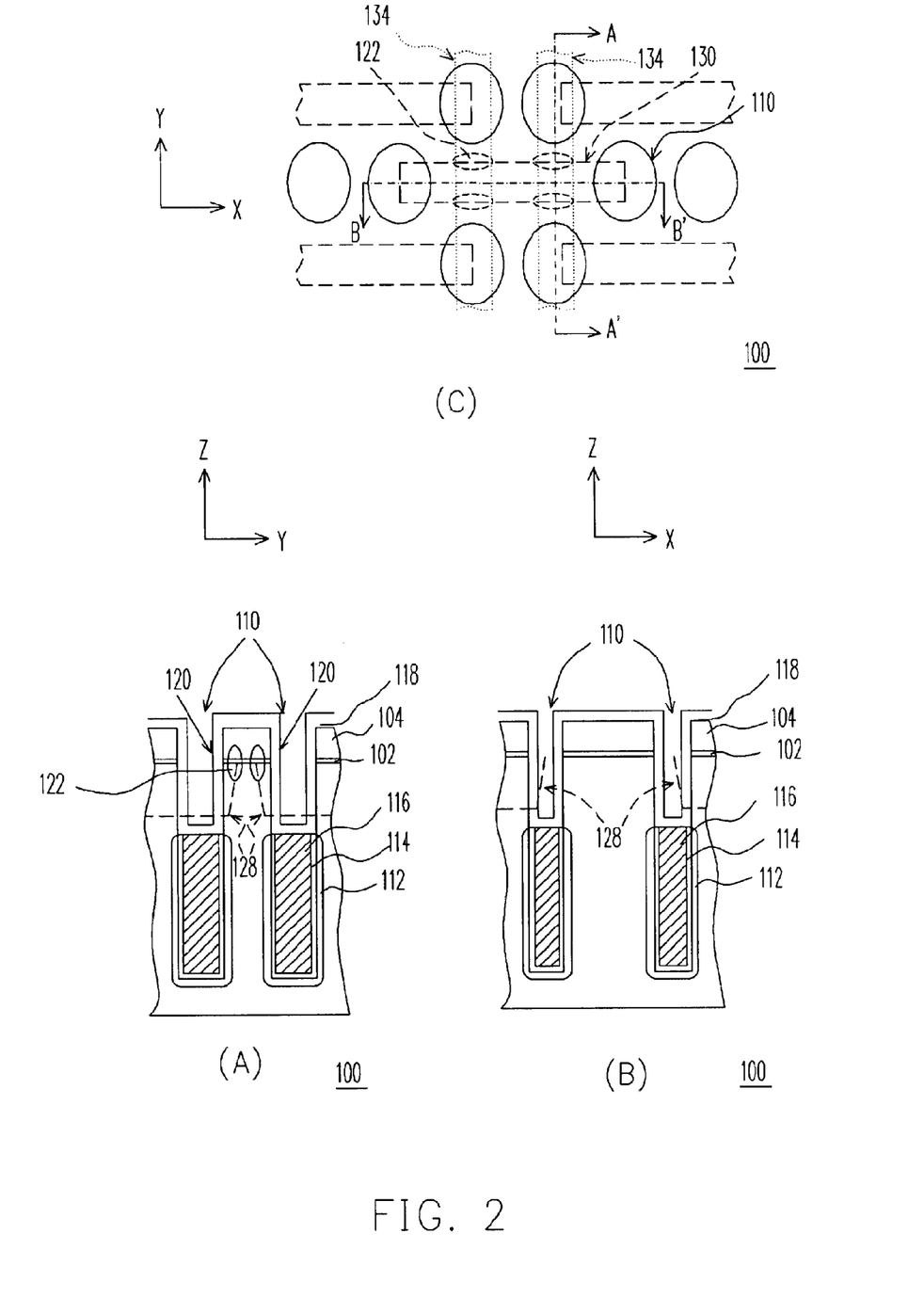
Figure 5:
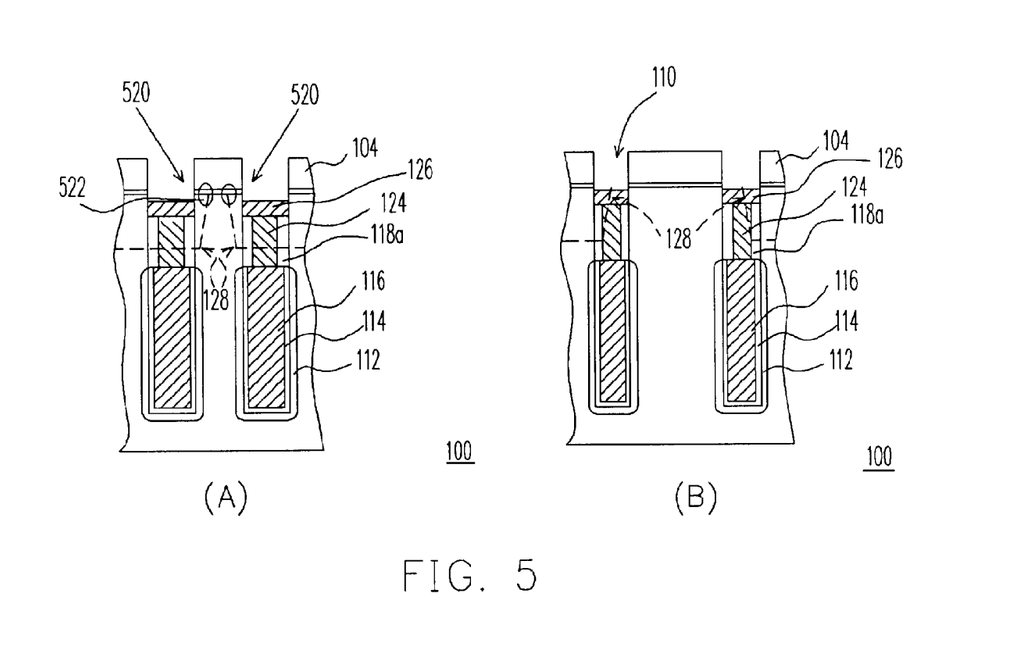
Figure 6:
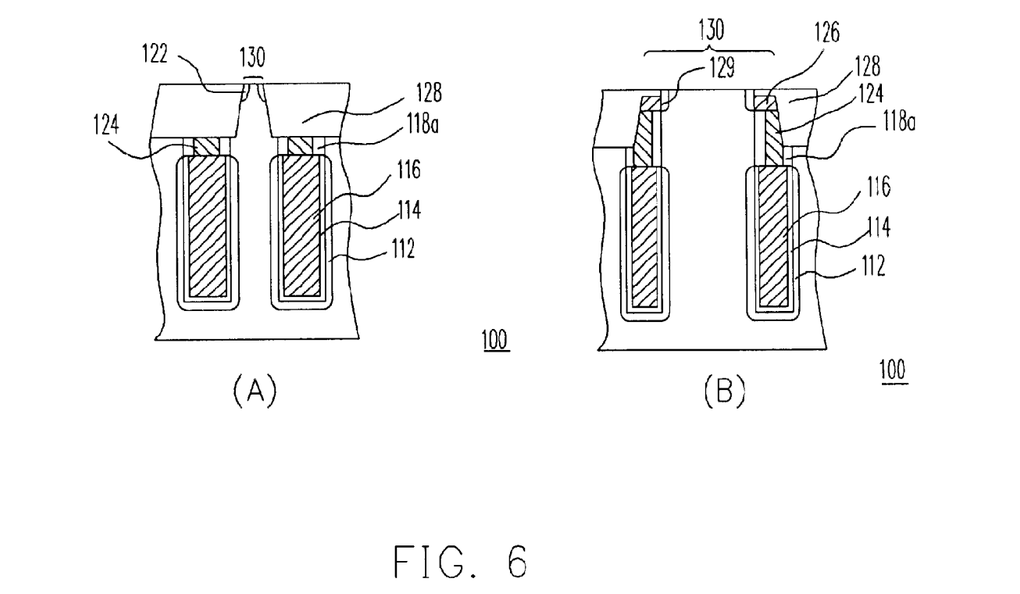
Figure 7:
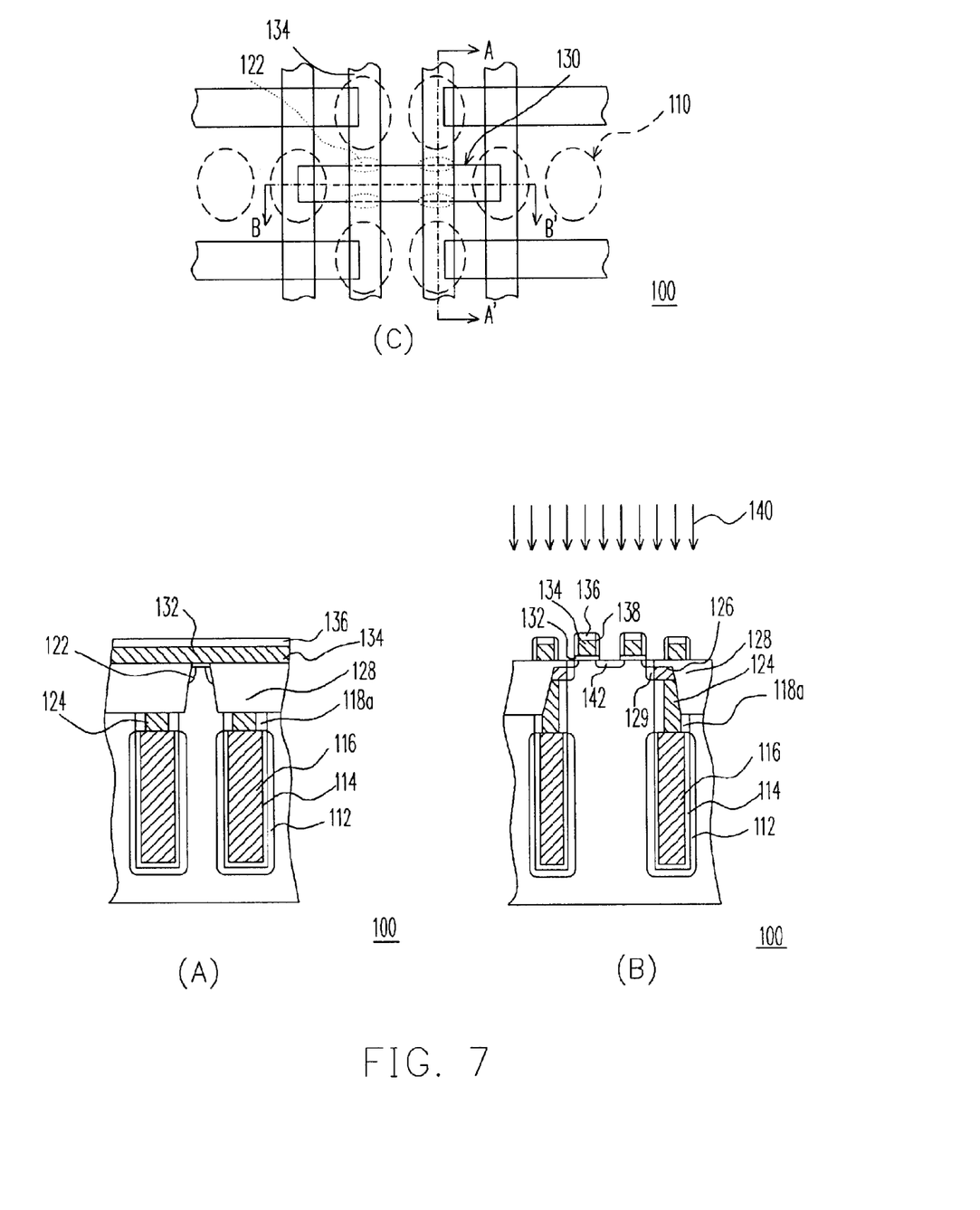

FIGS. 1 through 8 are diagrams showing the steps for producing a DRAM structure according to one preferred embodiment of this invention. In FIGS. 1, 2 and 7, the sub-diagrams with a label (C) are top views and the sub-diagrams with a label (A)/(B) are cross-sectional views along line A–A'/B–B' of the one labeled (C). As shown in FIG. 1(A)/(B)/(C), a substrate 100 such as a P-type monocrystalline silicon substrate is provided. Thereafter, a pad oxide layer 102 and a hard mask layer 104 are formed over the substrate 100. The hard mask layer 104 is a silicon nitride layer, for example. The hard mask layer 104, the pad oxide layer 102 and the substrate 100 are sequentially patterned to form a plurality of trenches 110 in the substrate 100. The trenches 110 are configured to form an eight F-square folded bit line DRAM layout detailed in U.S. Pat.

No. 5,874,758. In the eight F-square folded bit line DRAM layout, each area for forming an active region 130 is enclosed by four pairs of trenches 110 and each pair of trenches 110 is also enclosed by four areas for forming active regions 130. In addition, each area for forming an active region 130 has a pair of trenches in the Y direction located underneath a subsequently formed word line 134.

As shown in FIGS. 1(A)/(B), a doped region serving as an external electrode 112 is formed in the substrate 100 at a lower section of the trench 110. A capacitor dielectric layer 114 is formed on the surface of the trench 110. Conductive material is deposited into the lower section of the trenches to form conductive layers 116. Thereafter, the capacitor dielectric layer 114 not covered by the conductive layer 116 is removed. The dopants inside the external electrode 112 include arsenic (As) and the capacitor dielectric layer 114 is an oxide/nitride/oxide (ONO) composite layer or a nitride/oxide (NO) composite layer, for example. The conductive layer 116 serves as an inner electrode for a capacitor. In general, the conductive layer 116 is fabricated using N-type polysilicon, for example. The conductive layer 116 within the lower section of the trenches 110 is formed, for example, by depositing a conductive material to fill the trenches 110 entirely and then etching back the conductive material. In addition, the dash lines with a label 128 show a profile of a subsequently formed isolation region 128.

As shown in FIGS. 2(A)/(B)/(C), a conformal dielectric layer 118 is formed over the substrate. The conformal dielectric layer 118 is, for example, a silicon oxide layer formed by performing a chemical vapor deposition using ozone (O3) and tetra-ethyl-ortho-silicate (TEOS) as reactive gases. The dielectric layer 118 is a precursor to a subsequently formed collar dielectric layer. Thereafter, a tilt ion implantation 120 is carried out at a tilt angle along the Y direction through the upper section of the trenches 110. Ultimately, doped regions 122 are formed on the side edges of the active region 130 adjacent to the isolation region 128. The doped regions 122 have a conductive type identical to the substrate 100. Preferably, the concentration of dopants inside the doped regions 122 is between $1 \times 10^{16}$ to $5 \times 10^{18}$. Because the pair of trenches 110 in the Y direction in FIG. 2(A) is located under two subsequently formed word lines 134 and the word line covered portion of the active region 130 are channel regions, the doped regions 122 are formed in a self-aligned manner. That is, the doped regions 122 are automatically formed in the substrate 100 on each side of the active region, on which predetermined channel region will be formed, adjacent to the isolation region 128 after the tilt ion implantation.

Figure 3:
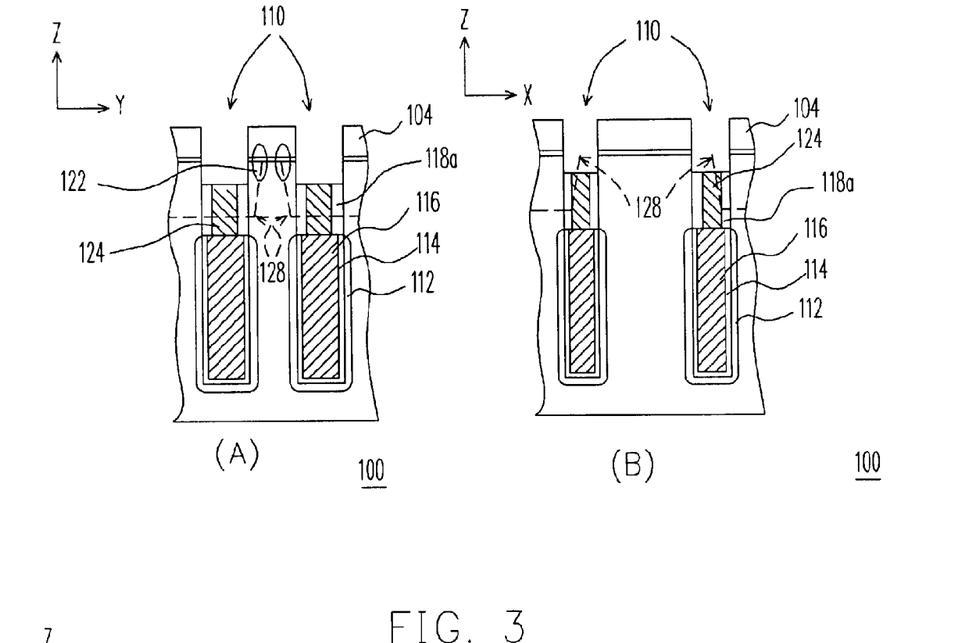

As shown in FIGS. 3(A)/(B), the dielectric layer 118 above the conductive layer 116 and the hard mask layer 104 is removed and then another conductive material is deposited into the trenches 110 to form conductive layers 124 that expose a portion of the dielectric layer 118. The conductive layer 116 is an N-type polysilicon layer, for example. Thereafter, the dielectric layers 118 above the conductive layers 124 are removed to form collar dielectric layers 118a.

Figure 4:
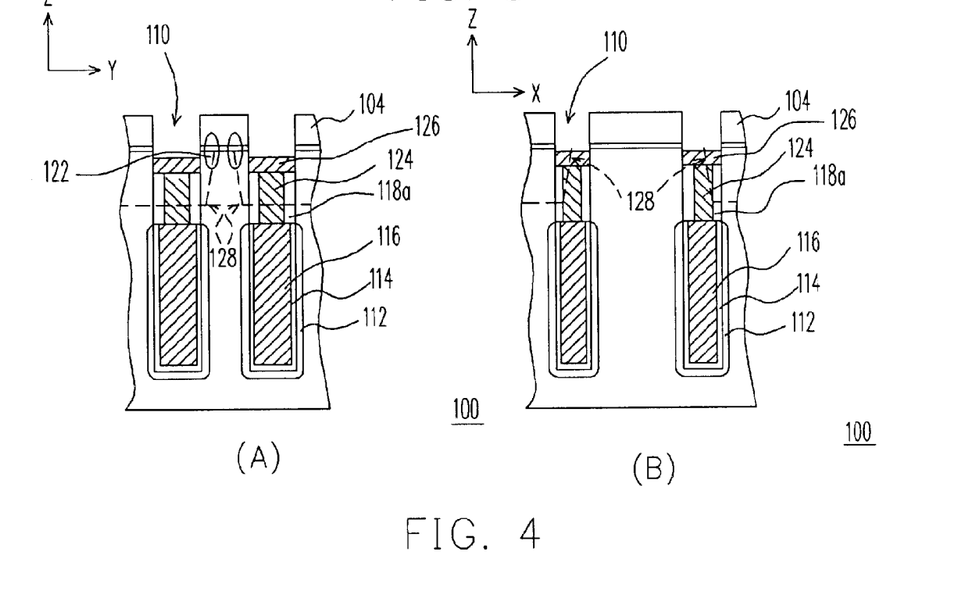

As shown in FIGS. 4(A)/(B), another conductive material is deposited into the trenches; 110 to form conductive layers 126 with a top surface below the top surface of the substrate 100. The conductive material is N-type polysilicon, for example. The conductive layers 126 serve as an electrical connection between the inner electrode 116 and the source/drain region of a subsequently formed access transistor.

Although the aforementioned tilt ion implantation is carried out after forming the dielectric layer 118, the implantation to form doped regions 522 can alternatively be processed after forming the conductive layers 126. The implantation is shown in FIGS. 5(A)/(B) by an arrow with a label 520. Because the trenches 110 are almost completely filled by now, the doped regions 522 have an implantation depth smaller than the aforementioned doped regions 122.

As shown in FIGS. 6(A)/(B), an isolation region 128 is formed in the substrate 100 to pattern the active regions 130. Since the position of the isolation region 128 relative to the trenches 110 has been explained before, detailed description is not repeated. As shown in FIG. 6(A), the doped region 122 for lowering sub-threshold current is formed in the active regions 130 close to the isolation region 128. The isolation region 128 is a shallow trench isolation (STI) structure fabricated using silicon oxide material, for example. In the process of fabricating the isolation region 128, thermal treatment is often required. During the thermal treatment, some dopants within the conductive layers 126 also diffuse into the substrate 100 to form a buried strap 129 as shown in FIG. 6(B).

As shown in FIGS. 7(A)/(B)/(C), a gate dielectric layer 132 is formed over the substrate 1100 and then a plurality of word lines 134 with a cap layer 136 thereon is formed over the gate dielectric layer 132. The word lines 134 cover parts of the active region 130, serving as channel regions, and the doped regions 122 thereon. Thereafter, using the cap layers 136 and the word lines 134 as a mask, an ion implantation 1140 is performed to form source/drain regions 142. The source/drain region 142 between two word lines 134 above the same active region 130 is a common source/drain region. Meanwhile, each source/drain region 142 on the side edge of the active region 130 is connected to a buried strap 129 for connecting with a corresponding inner electrode 116. Thereafter, spacers 138 are formed on the sidewalls of the cap layers 136 and the word lines 134. The cap layers 136 and the spacers 138 are fabricated using silicon nitride material, for example. The cap layers 136 and the spacers 138 enclose and prevent the word lines 134 from being exposed during a subsequent bit line contact processing operation.

Figure 8:
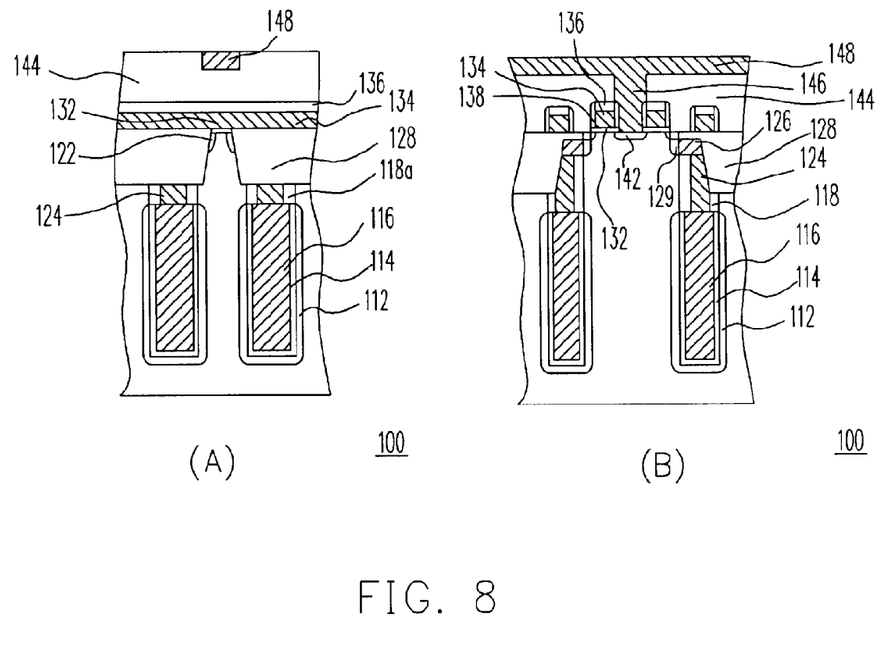

As shown in FIGS. 8(A)/(B), an insulation layer 144 is formed over the substrate 1100 covering various aforementioned structures. Thereafter, bit line contacts 146 are formed within the insulation layer 144 and then bit lines 148 are formed over the insulation layer 144 in contact with various bit line contacts 146. Because the top and side surface of each word line 134 are protected through the cap layer 136 and sidewall spacers 138, the bit line contacts 146 are formed in a self-aligned process.

In addition, FIGS. 7 and 8 are also sectional views of a DRAM structure according to one preferred embodiment of this invention. The DRAM has a conventional eight F-square folded bit line buried strap structure. However, doped regions 122 are also incorporated in the design in this invention. The doped region 122 has a conductive type identical to the substrate 100. The DRAM structure comprises a substrate 100, active regions 130 surrounded by an isolation region 128, trenches 110, word lines 134, (common) source/drain regions 142, contacts 14.6, bit lines 148 and doped regions 122. The substrate 100 has a plurality of trenches 110. Each trench 110 encloses a capacitor comprising an external electrode 112, a capacitor dielectric layer 114 and an inner electrode 116. A pair of trenches 110 is positioned on all four sides of each active region 130. Among the pairs of trenches 110 on the left and right side of the active region 130, the capacitor inside one of the trenches 110 is electrically coupled to the active region 130.

Furthermore, among the pairs of trenches 110 on the front and back sides of the active region 130, the capacitors inside the trenches 110 are electrically coupled to other active regions 130 (refer to FIG. 1). In addition, a pair of neighboring word lines 134 passes through the active region 130 as well as the pair of front and back trenches 110. The word lines 134 run in a first direction. The areas within the active region 130 covered by the pair of word lines 134 form two channel regions. The doped regions 122 are formed on the two sides of each channel region adjacent to the isolation region 128. The active region 130 between the two word lines 134 has a common source/drain region 142 electrically connected to the bit line 148 running in a second direction. The active region 1.30 also has two source/drain regions 142 on the outer edge of the two word lines 134 with each source/drain region 142 electrically connected to a corresponding capacitor.

As shown in FIG. 7(C), doped regions 122 having a conductive type identical to the substrate 100 are formed on each side of the channel region (the section in the active region 130 covered by the word lines 134) close to the isolation region 128. Therefore, sub-threshold current in the channel region is suppressed. Furthermore, if the depth of the doped region 122 is increased, even punch-through leakage can be minimized. For example, the doped region 122 formed after the dielectric layer 118 has a depth greater than the doped region 522 (shown in FIG. 5(A)) formed after the Conductive layer 126. Consequently, the doped region 122 is better able to resist any punch-through leakage.

The tilt ion implantation (FIG. 2(A)) is preferably carried out after forming the dielectric layer 118 (FIG. 2(A)) (precursor to the collar dielectric layer) or after depositing the conductive material to form the topmost conductive layer 126 in the trenches 110 (FIG. 5(B)). However, the implantation can be carried out any time after forming the trenches 110 but before patterning the active regions 130. The only criteria is that the implantation must be carried out at a proper energy level and a proper tilt angle so that dopants can penetrate into the area on the side edges of the channel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for fabricating a dynamic random access memory (DRAM), comprising the steps of:
    providing a substrate;
    forming a plurality of trenches in the substrate;
    forming a capacitor inside each trench;
    patterning a plurality of active regions on the substrate;
    forming a plurality of word lines on the substrate;
    forming a pair of source/drain regions in each active region; and
    forming a plurality of bit lines over the substrate, wherein a first side edge of each active region has a first trench whose capacitor is coupled to the active region, furthermore, a second side edge of an adjacent active region has a second trench such that a word line passes through both the active region and the second trench, moreover, the area in the active region covered by the word line serves as a channel region;
    the source/drain regions of each active region are electrically connected to a capacitor and a bit line; and
    after forming the trenches but before patterning the active regions, further comprises performing an ion implantation tilted at an angle along the word line direction to form a doped region on each side of the predetermined channel region in the substrate such that the dopants within the doped regions has a conductive type identical to that of the substrate.

2. The DRAM process of claim 1, wherein the step of forming a capacitor in each trench comprises:
    forming an external electrode in the substrate at a lower section of the trench;
    forming a capacitor dielectric layer on the surface of the trench;
    depositing a conductive material into the trenches to form a first conductive layer; and
    connecting the first conductive layer with a corresponding source/drain region.

3. The DRAM process of claim 2, wherein after forming the first conductive layer in the trenches, the DRAM process further comprises:
    removing a portion of the first conductive layer above a lower trench section;
    forming a collar dielectric layer over a top surface of the lower trench section;
    forming a second conductive layer over the first conductive layer such that the second conductive layer is surrounded by the collar dielectric layer; and
    connecting the second conductive layer with a corresponding source/drain region.

4. The DRAM process of claim 3, wherein the ion implantation is carried out after forming the collar dielectric layer.

5. The DRAM process of claim 4, wherein the ion implantation is carried out after forming the collar dielectric layer but before forming the second conductive layer.

6. The DRAM process of claim 3, wherein after forming the second conductive layer, the DRAM process further comprises:
    forming a third conductive layer over the second conductive layer to provide a direct contact with a corresponding active region, wherein the third conductive layer is constructed using a doped semiconductor material; and
    activating the dopants within the third conductive layer to diffuse into the active region and form a buried strap structure for connecting with a corresponding source/drain region.

7. The DRAM process of claim 6, wherein a top surface of the third conductive layer is at a level below a top surface of the substrate.

8. The DRAM process of claim 7, wherein the ion implantation is carried out after forming the third conductive layer.

9. The DRAM process of claim 6, wherein material constituting the first conductive layer, the second conductive layer and the third conductive layer comprises doped polysilicon.

10. A process for fabricating a dynamic random access memory (DRAM), the process comprising the steps of:
    providing a substrate;
    forming a plurality of trenches in the substrate;
    forming a capacitor inside each trench;
    patterning a plurality of active regions on the substrate;

forming a plurality of word lines running in a first direction over the substrate;

forming a pair of source/drain regions and a common source/drain region in each active region; and forming a plurality of bit lines running in a second direction over the substrate, wherein all four side edges of each active region have a pair of trenches such that the capacitor in one of the trenches in each pair of trenches along the second direction is coupled to the active region and the capacitors in the pair of trenches along the first direction are coupled to other active regions, furthermore, a pair of adjacent word lines passes through the active region and the two pairs of trenches along the first direction, moreover, the areas in the active region covered by the two word lines serve as two channel regions; each of the two source/drain regions within each active region is electrically connected to a capacitor and the common source/drain region is electrically connected to a bit line; and after forming the trenches but before patterning the active regions, the process further comprises performing an ion implantation tilted at an angle along the first direction to form four doped regions on each side of the predetermined two channel regions in the substrate such that the dopants within the doped regions has a conductive type identical to the substrate.

11. The DRAM process of claim 10, wherein the step of forming a capacitor in each trench comprises:

forming an external electrode in the substrate at a lower section of the trench;

forming a capacitor dielectric layer on the surface of the trench;

depositing a conductive material into the trenches to form a first conductive layer; and connecting the first conductive layer with a corresponding source/drain region.

12. The DRAM process of claim 11, wherein after forming the first conductive layer in the trenches, the DRAM process further comprises:

removing a portion of the first conductive layer above a lower trench section;

forming a collar dielectric layer over a top surface of the lower trench section;

forming a second conductive layer over the first conductive layer such that the second conductive layer is surrounded by the collar dielectric layer; and connecting the second conductive layer with a corresponding source/drain region.

13. The DRAM process of claim 12, wherein the ion implantation is carried out after forming the collar dielectric layer.

14. The DRAM process of claim 13, wherein the ion implantation is carried out after forming the collar dielectric layer but before forming the second conductive layer.

15. The DRAM process of claim 12, wherein after forming the second conductive layer, the DRAM process further comprises:

forming a third conductive layer over the second conductive layer to provide a direct contact with a corresponding active region, wherein the third conductive layer is constructed using a doped semiconductor material; and activating the dopants within the third conductive layer to diffuse into the active region and form a buried strap structure for connecting with a corresponding source/drain region.

16. The DRAM process of claim 15, wherein a top surface of the third conductive layer is at a level below a top surface of the substrate.

17. The DRAM process of claim 16, wherein the ion implantation is carried out after forming the third conductive layer.

18. The DRAM process of claim 15, wherein material constituting the first conductive layer, the second conductive layer and the third conductive layer comprises doped polysilicon.

\* \* \* \* \*